(12) United States Patent
Hsiao

(10) Patent No.: US 9,941,907 B2
(45) Date of Patent: Apr. 10, 2018

(54) MEMORY MANAGEMENT METHOD, MEMORY STORAGE DEVICE AND MEMORY CONTROL CIRCUIT UNIT

(71) Applicant: EpoStar Electronics Corp., Hsinchu (TW)

(72) Inventor: Yu-Hua Hsiao, Hsinchu County (TW)

(73) Assignee: EpoStar Electronics Corp., Hsinchu (TW)

( * ) Notice: Subject to any disclaimer, the term of this patent is extended or adjusted under 35 U.S.C. 154(b) by 0 days.

(21) Appl. No.: 15/235,107

(22) Filed: Aug. 12, 2016

(65) Prior Publication Data

US 2018/0019765 A1    Jan. 18, 2018

(30) Foreign Application Priority Data

Jul. 13, 2016 (TW) .............................. 105122009 A

(51) Int. Cl.
| | |
|---|---|
| G11C 29/00 | (2006.01) |
| H03M 13/35 | (2006.01) |
| G11C 16/14 | (2006.01) |
| G11C 16/10 | (2006.01) |
| G06F 11/10 | (2006.01) |
| G11C 29/52 | (2006.01) |

(52) U.S. Cl.
CPC ....... *H03M 13/356* (2013.01); *G06F 11/1068* (2013.01); *G11C 16/10* (2013.01); *G11C 16/14* (2013.01); *G11C 29/52* (2013.01)

(58) Field of Classification Search
CPC ...... H03M 13/356; G11C 16/14; G11C 16/10; G11C 29/52; G06F 11/1068
See application file for complete search history.

(56) References Cited

U.S. PATENT DOCUMENTS

| | | | | |
|---|---|---|---|---|
| 2010/0211833 | A1* | 8/2010 | Weingarten | G06F 11/1068 714/704 |
| 2015/0293814 | A1* | 10/2015 | Liang | G06F 11/1068 714/704 |

* cited by examiner

*Primary Examiner* — Sam Rizk
(74) *Attorney, Agent, or Firm* — JCIPRNET

(57) ABSTRACT

A memory management method, a memory storage device and a memory control circuit unit are provided. The method includes: configuring a default encoding rule for a first physical erasing unit which includes encoding data to be stored to the first physical erasing unit based on a default code rate; configuring a first encoding rule, for the first physical erasing unit according to error estimating information of the first physical erasing unit, which includes encoding data to be stored to a first-type physical programming unit and a second-type physical programming unit belonging to the first physical erasing unit based on a first code rate and a second code rate respectively, where a value of the first code rate is greater than a value of the default code rate, and a value of the second code rate is less than the value of the default code rate.

18 Claims, 7 Drawing Sheets

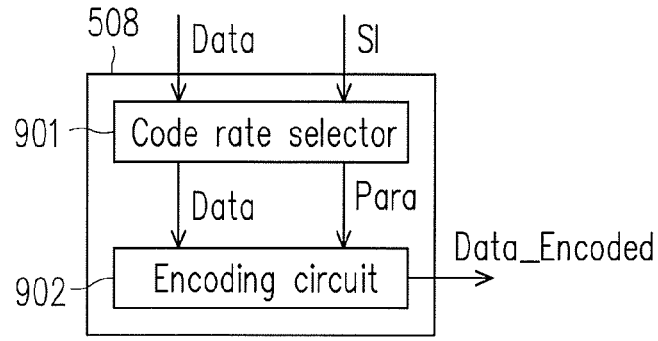

FIG. 9

```
Configuring a default encoding rule for a first physical
erasing unit, where the default encoding rule includes
encoding data to be stored to a first-type physical
programming unit belonging to a first physical erasing unit
based on a default code rate and encoding data to be        ~ S1001
stored to a second-type physical programming unit
belonging to the first physical erasing unit based on the
default code rate
```

Obtaining error estimating information of the first physical erasing unit  ~ S1002

Configuring a first encoding rule for the first physical erasing unit according to the error estimating information of the first physical erasing unit, where the first encoding rule includes encoding data to be stored to the first-type physical programming unit belonging to the first physical erasing unit based on a first code rate and encoding data to be stored to the second-type physical programming unit belonging to the first physical erasing unit based on a second code rate, where a value of the first code rate is greater than a value of the default code rate, and a value of the second code rate is less than the value of the default code rate  ~ S1003

FIG. 10

MEMORY MANAGEMENT METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105122009, filed on Jul. 13, 2016. The entirety of the above-mentioned patent application is hereby incorporated by reference herein and made a part of this specification.

BACKGROUND

Technical Field

The invention relates to a memory management technique, and more particularly, to a memory management method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In certain memory devices, data is encoded first and then stored. Later, when it is required to read such data, the read data is decoded so the attempt of correcting errors therein may be conducted. However, as a use time of the memory device increases, there may be increasingly more memory blocks being considered as damaged one which can no longer be used. When the damaged memory blocks reaches a predetermined number, the memory device enters a write protect state. In the write protect state, no new data can be written into the memory device. Therefore, it is one of the important issues to be addressed by those skilled in the art as how to extend a lifetime of the memory blocks without impacting normal usages of the memory device.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a memory management method, a memory storage device and a memory control circuit unit, which are capable of extending the lifetime of the memory storage device.

An exemplary embodiment of the invention provides a memory management method for a rewritable non-volatile memory module having a plurality of physical erasing units. The memory management method includes: configuring a default encoding rule for a first physical erasing unit among the physical erasing units, where the default encoding rule includes encoding data to be stored to a first-type physical programming unit belonging to the first physical erasing unit based on a default code rate and encoding data to be stored to a second-type physical programming unit belonging to the first physical erasing unit based on the default code rate; obtaining error estimating information of the first physical erasing unit; and configuring a first encoding rule for the first physical erasing unit according to the error estimating information of the first physical erasing unit, where the first encoding rule includes encoding the data to be stored to the first-type physical programming unit belonging to the first physical erasing unit based on a first code rate and encoding the data to be stored to the second-type physical programming unit belonging to the first physical erasing unit based on a second code rate, where a value of the first code rate is greater than a value of the default code rate, and a value of the second code rate is less than the value of the default code rate.

Another exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module. The memory control circuit unit is configured to configure a default encoding rule for a first physical erasing unit among the physical erasing units. The default encoding rule includes encoding data to be stored to a first-type physical programming unit belonging to the first physical erasing unit based on a default code rate and encoding data to be stored to a second-type physical programming unit belonging to the first physical erasing unit based on the default code rate. The memory control circuit unit is further configured to obtain error estimating information of the first physical erasing unit. The memory control circuit unit is further configured to configure a first encoding rule for the first physical erasing unit according to the error estimating information of the first physical erasing unit. The first encoding rule includes encoding the data to be stored to the first-type physical programming unit belonging to the first physical erasing unit based on a first code rate and encoding the data to be stored to the second-type physical programming unit belonging to the first physical erasing unit based on a second code rate, where the value of the first code rate is greater than a value of the default code rate, and a value of the second code rate is less than the value of the default code rate.

Another exemplary embodiment of the invention provides a memory control circuit unit, which is configured to control a rewritable non-volatile memory module having a plurality of physical erasing units. The memory control circuit unit includes a host interface, a memory interface, an error checking and correcting circuit, and a memory management circuit. The host interface is configured to couple to a host system. The memory interface is configured to couple to a rewritable non-volatile memory module. The memory management circuit is coupled to the host interface, the memory interface and the error checking and correcting circuit. The memory management circuit is configured to configure a default encoding rule for a first physical erasing unit among the physical erasing units. The default encoding rule includes encoding data to be stored to a first-type physical programming unit belonging to the first physical erasing unit based on a default code rate and encoding data to be stored to a second-type physical programming unit belonging to the first physical erasing unit based on the default code rate by the error checking and correcting circuit. The memory management circuit is further configured to obtain error estimating information of the first physical erasing unit. The memory management circuit is further configured to configure a first encoding rule for the first physical erasing unit according to the error estimating information of the first physical erasing unit. The first encoding rule includes encoding the data to be stored to the first-type physical programming unit belonging to the first physical erasing unit based on a first code rate and encoding the data to be stored to the second-type physical programming unit belonging to the first physical erasing unit based on a second code rate by the error checking and correcting circuit. A value of the first code rate is greater than a value of the default code rate, and a value of the second code rate is less than the value of the default code rate.

Based on the above, the invention is capable of dynamically updating the encoding rule corresponding to a specific physical erasing unit. By controlling the code rates of the physical programming units of various types belonging to the specific physical erasing unit, the lifetime of the specific physical erasing unit may be extended. As a result, the overall lifetime of the memory storage device may also be extended.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a schematic diagram illustrating the error checking and correcting circuit according to an exemplary embodiment of the invention.

FIG. 10 is a flowchart illustrating a memory management method according to an exemplary embodiment of the invention.

DESCRIPTION OF THE EMBODIMENTS

Figure 1:
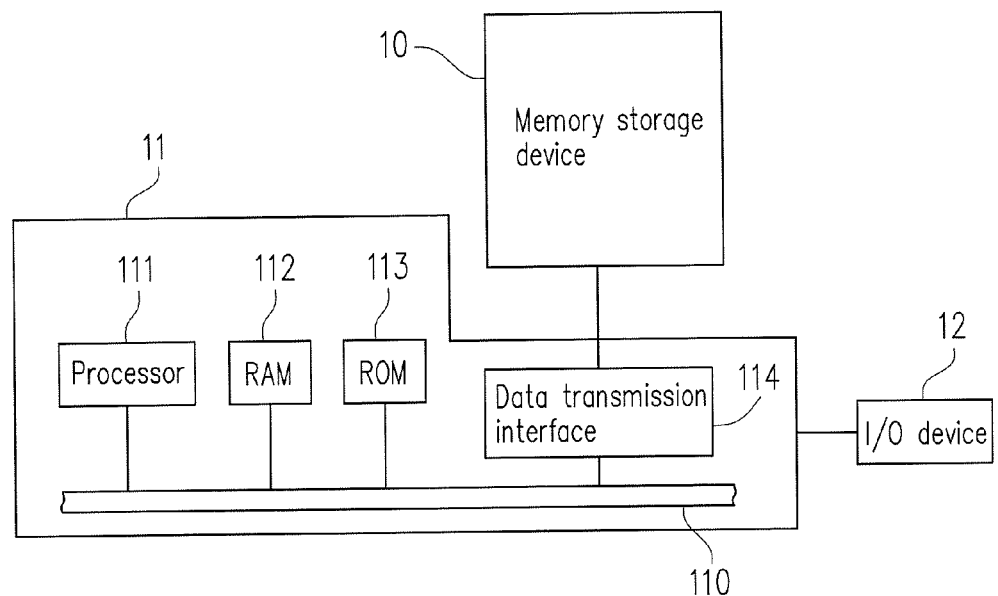
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so the host system may write data into the memory storage device or read data from the memory storage device.

Figure 2:
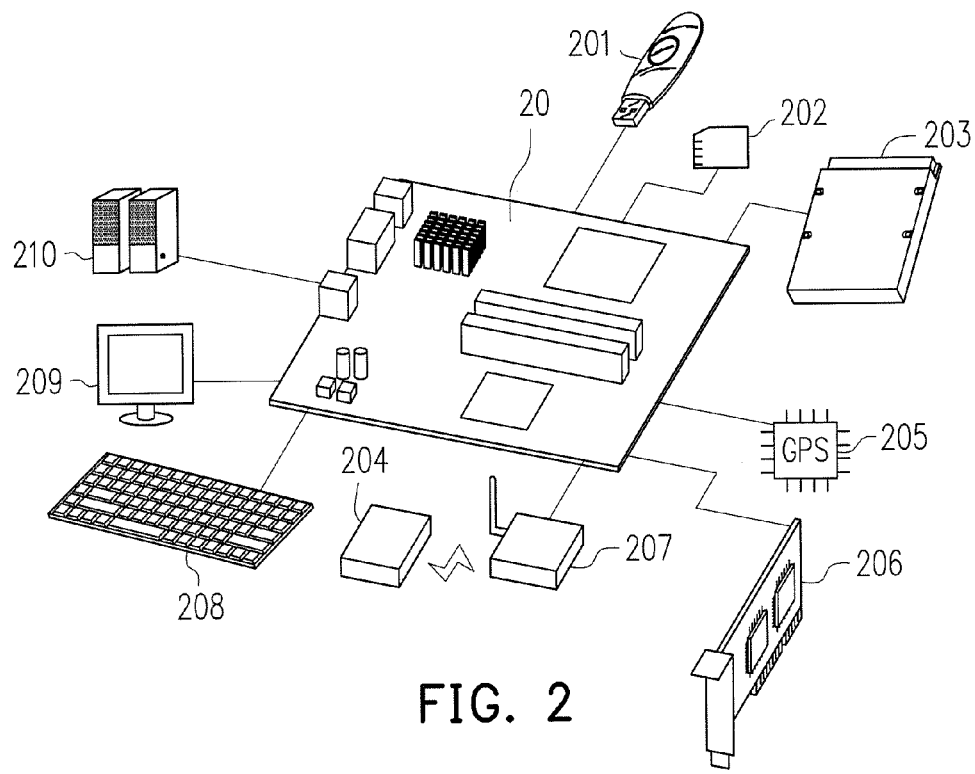
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are connected to a system bus 110.

In the present exemplary embodiment, the host system 11 is connected to a memory storage device 10 through the data transmission interface 114. For example, the host system 11 can store data to the memory storage device 10 or read data from the memory storage device 10 through the data transmission interface 114. Further, the host system 11 is connected to an I/O device 12 through the system bus 110. For example, the host system 11 can transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be connected to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be connected to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage device 204 through the wireless transmission device 207.

Figure 3:
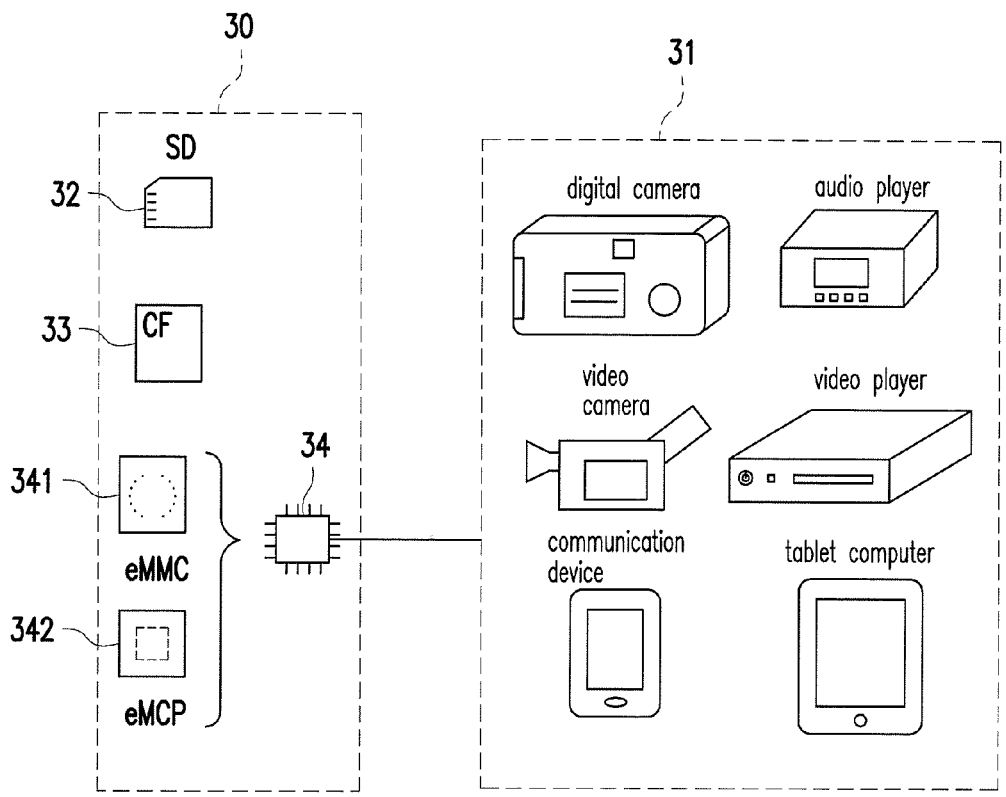
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly connecting a memory module onto a substrate of the host system, such as an eMMC (embedded Multi Media Card) 341 and/or an eMCP (embedded Multi Chip Package) storage device 342.

Figure 4:
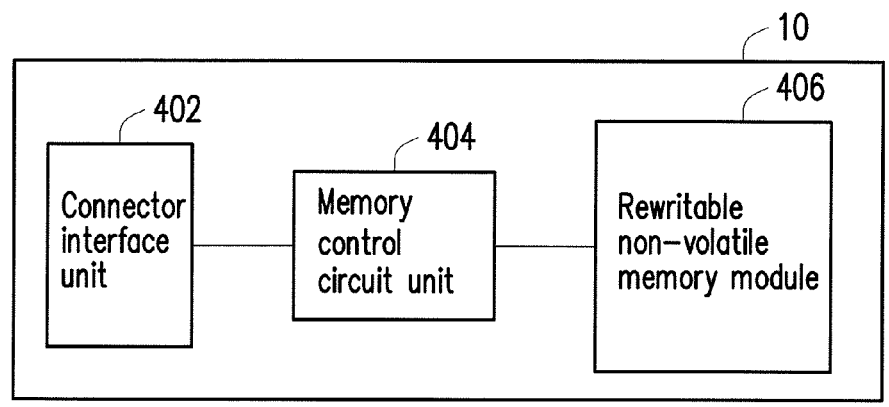
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

The connection interface unit 402 is configured to connect the memory storage device 10 to the host system 11. In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is connected to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

Figure 5:
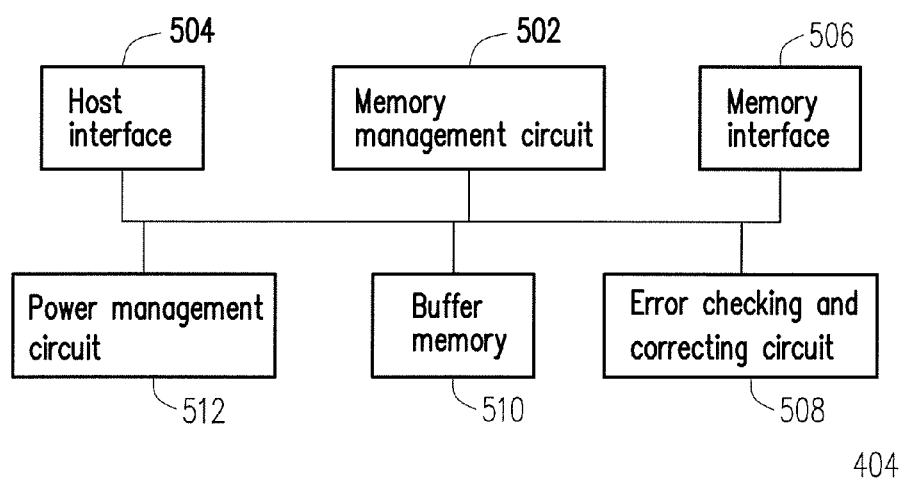
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands and the control commands are executed to perform various operations such as writing, reading and erasing data during operation of the memory storage device 10. Hereinafter, operations of the memory management circuit 502 are described as equivalent to describe operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory module dedicated to store system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are connected to the microprocessor. The memory cell management circuit is configured to manage the memory cells of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further issue command sequence of other types to the rewritable non-volatile memory module 406 for instructing to perform the corresponding operations.

The host interface 504 is connected to the memory management circuit 502 and configured to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it should be understood that the invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is connected to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is connected to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In the present exemplary embodiment, the error checking and correcting circuit 508 supports a low-density parity-check (LDPC) code. For example, the error checking and correcting circuit 508 may use the LDPC code for encoding and decoding. However, in another exemplary embodiment, the error checking and correcting circuit 508 may also support other encoding/decoding algorithms such as a BCH code, a convolutional code, a block code, which are not particularly limited in the invention. Person of ordinary skill in the art should be able to understand how to use said encoding/decoding algorithms to perform encoding and decoding operations, and thus detail regarding the same are not repeated hereinafter.

In an exemplary embodiment, the memory control circuit unit 404 further includes a buffer memory 510 and a power management circuit 512. The buffer memory 510 is connected to the memory management circuit 502 and configured to temporarily store data and commands from the host system 11 or data from the rewritable non-volatile memory module 406. The power management unit 512 is connected to the memory management circuit 502 and configured to control a power of the memory storage device 10.

Figure 6:
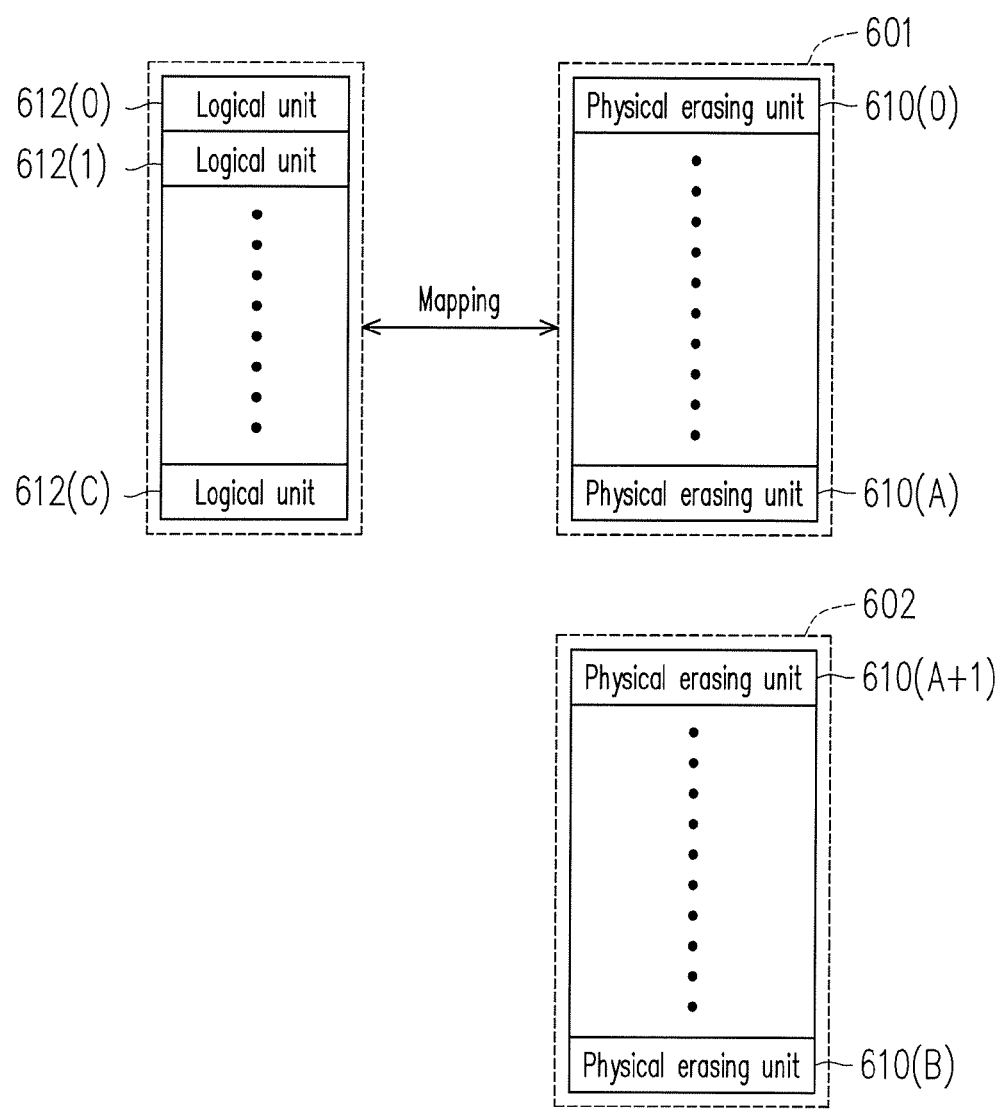
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. It should be understood that term, such as "group", is logical concepts which describe operations in the physical units of the rewritable non-volatile memory module 406 in the following exemplary embodiments. That is to say, the physical units of the rewritable non-volatile memory module 406 are logically operated while actual locations of the physical units of the rewritable non-volatile memory module 406 remain unchanged.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than two bits, the physical programming units on the same word line can be at least classified into a lower physical programming unit and an upper physical programming unit. For example, if one memory cell can store two bits (e.g., "11", "10", "00" or "01"), the physical programming units on the same word line includes one lower physical programming unit and one upper physical programming unit. In the MLC NAND flash memory, a writing speed of the lower physical programming unit is higher than a writing speed of the upper physical programming unit, and/or a reliability of the lower physical programming unit is higher than a reliability of the upper physical programming unit. For example, if one memory cell can store three bits (e.g., "111", "110", "100", "011", "010", "000", "001" or "101"), the physical programming units on the same word line includes one lower physical programming unit, one upper physical programming unit and one extra physical programming unit.

In the present exemplary embodiment, the physical programming unit is the minimum unit for programming. That is, the physical programming unit is the minimum unit for writing data. For example, the physical programming unit is a physical page or a physical sector. When the physical programming unit is the physical page, the physical programming unit usually includes a data bit area and a redundancy bit area. The data bit area includes multiple physical sectors configured to store user data, and the redundant bit area is configured to store system data (e.g., an error correcting code). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Referring to FIG. 6, the memory management circuit 502 logically groups physical erasing units 610(0) to 610(B) of the rewritable non-volatile memory module 406 into a storage area 601 and a replacement area 602. The physical erasing units 610(0) to 610(A) in the storage area 601 are configured to store data, whereas the physical erasing units 610(A+1) to 610(B) in the replacement area 602 are configured to replace damaged physical erasing units in the storage area 601. For example, if data read from one specific physical erasing unit includes too many errors and thus cannot be corrected, the specific physical erasing unit will be considered as a damaged physical erasing unit. In an exemplary embodiment, the damaged physical erasing unit is also known as a bad block. It should be noted that, if there is no available physical erasing units in the replacement area 602, the memory management circuit 502 declares that the memory storage device 10 is in a write protect state so data can no longer be written thereto.

The memory management circuit 502 assigns logical units 612 (0) to 612(C) for mapping to the physical erasing units 610(0) to 610(A) in the storage area 601. For example, in this exemplary embodiment, the host system 11 accesses the data stored in the storage area 601 through a logical address (LA). Therefore, each logical unit in the logical units 612(0) to 612(C) refers to one logical address. However, in another exemplary embodiment, each logical unit in the logical units 612(0) to 612(C) may also refer to one logical programming unit, one logical erasing unit or a composition of a plurality of consecutive or non-consecutive logical addresses. In addition, each logical unit in the logical units 612(0) to 612(C) may also be mapped to one or more physical erasing units.

The memory management circuit 502 records a mapping relation (also known as a logical-to-physical mapping relation) between the logical units and the physical erasing units into at least one logical-to-physical mapping table. When the host system 11 intends to read the data from the memory storage device 10 or write the data into the memory storage device 10, the memory management circuit 502 may access the data in the memory storage device 10 according to the logical-to-physical mapping table.

In the present exemplary embodiment, the error checking and correcting circuit 508 encodes user data (i.e., data to be stored from the host system 11) based on one code rate and generates encoded data, where such code rate refers to a proportion of the user data in the encoded data. For example, assuming that the user data includes (n–k) bits and the encoded data generated from the encoding operation includes n bits, the code rate of the user data is (n–k)/n. In other words, the user data of (n–k) bits encoded based on the code rate of (n–k)/n can generate the encoded data of n bits, where the encoded data of n bits is composed of the user data of (n–k) bits and parity data of k bits. Further, the parity data of k bits may be considered as the error correcting code (and/or the error detecting code) corresponding to the user data of (n–k) bits. Then, the encoded data of n bits is stored to one specific physical programming unit in the rewritable non-volatile memory module 406. For example, one or more logical units to which the user data of (n–k) bits belongs are mapped to said specific physical programming unit. In said specific physical programming unit, the user data of (n–k)/n bits is stored in the data bit area, and the parity data k bits is stored in the redundancy bit area.

In the initial stage of using the memory storage device 10, the memory management circuit 502 configures one encoding rule (hereinafter, also known as a default encoding rule) for each of the physical erasing units in the rewritable non-volatile memory module 406. According to the default encoding rule, the error checking and correcting circuit 508 can encode data to be stored to a corresponding physical erasing unit based on one code rate (hereinafter, also known as a default code rate).

In the present exemplary embodiment, the default encoding rules configured for each of the physical erasing unit in the rewritable non-volatile memory module 406 are identical. That is, the default code rates for encoding the data to be stored to each of the physical erasing units are the same. However, in another exemplary embodiment, the default encoding rules configured for different physical erasing units in the rewritable non-volatile memory module 406 may also be different so the data to be stored to the different physical erasing units are encoded based on different default code rates. For example, taking into consideration a location of one physical erasing unit in the rewritable non-volatile memory module 406, a material property of one physical erasing unit, an operating mode of one physical erasing unit (e.g., operated in SLC, MLC or TLC modes) and/or relative locations of multiple physical erasing units in the rewritable non-volatile memory module 406, the different default encoding rules may be initially configured for different physical erasing units.

Figure 7A:
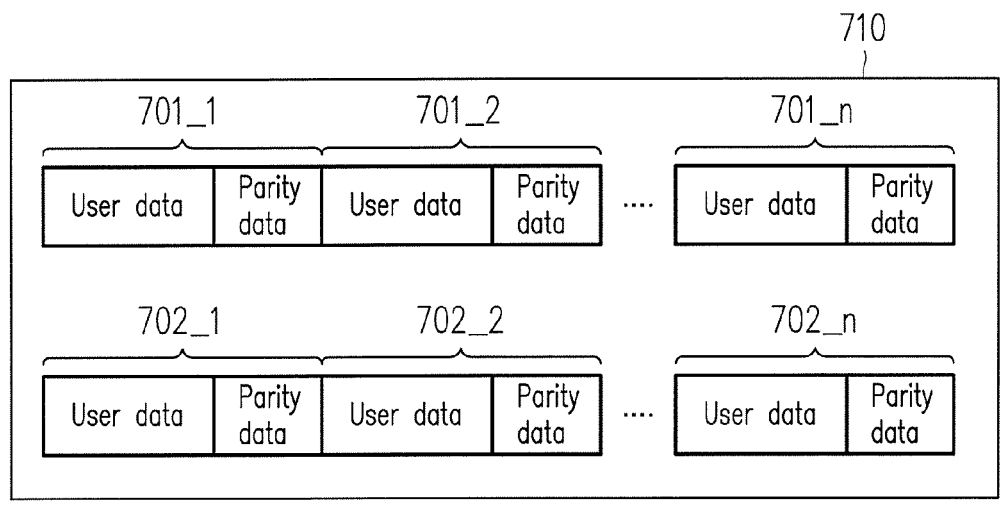
FIG. 7A is a schematic diagram illustrating the data encoded based on a default encoding rule according to an exemplary embodiment of the invention.

FIG. 7A is a schematic diagram illustrating the data encoded based on a default encoding rule according to an exemplary embodiment of the invention.

Referring to FIG. 7A, in the present exemplary embodiment, a physical erasing unit 710 serves as a first physical erasing unit, and each memory cell in the physical erasing unit 710 can store two bits. The physical erasing unit 710 includes a plurality of first-type physical programming units 701_1 to 701_$n$ and a plurality of second-type physical programming units 702_1 to 702_$n$. Among them, each of the first-type physical programming units 701_1 to 701_$n$ is one lower physical programming unit, and each of the second-type physical programming units 702_1 to 702_$n$ is one upper physical programming unit. Further, the first-type physical programming unit 701_1 and the second-type physical programming unit 702_1 are composed of the memory cells on the same word line, the first-type physical programming unit 701_2 and the second-type physical programming unit 702_2 are composed of the memory cells on the same word line, the first-type physical programming unit 701_$n$ and the second-type physical programming unit 702_$n$ are composed of the memory cells on the same word line, and the rest may be deduced by analogy.

The memory management circuit 502 configures one default encoding rule for the physical erasing unit 710. The default encoding rule includes encoding data to be stored to the first-type physical programming units 701_1 to 701_$n$ based on one default code rate and encoding data to be stored to the second-type physical programming units 702_1 to 702_$n$ based on the same default code rate by the error checking and correcting circuit 508. Because the code rates for encoding the data are identical (i.e., the default code rate), ratios of the user data and the parity data in the encoded data stored to each of the first-type physical programming units and the second-type physical programming units are identical. For example, the ratio of the user data and the parity data in the first-type physical programming unit 701_$n$ matches the default code rate, and the ratio of the user data and the parity data in the second-type physical programming unit 702_$n$ also matches the default code rate, as shown in FIG. 7A. It is noted that, the ratio of the user data and the parity data refers to as a ratio of data volumes.

As a use time of the memory storage device 10 increases, the errors included in the data read from the first physical erasing unit also become increasingly more. The memory management circuit 502 can obtain error estimating information of the first physical erasing unit, and configure another encoding rule (hereinafter, also known as a first encoding rule) for the first physical erasing unit according to the error estimating information. The error estimating information may include any information related to a usage level and/or an error rate of the first physical erasing unit. For example, the error estimating information may include a write count of the first physical erasing unit, a read count of the first physical erasing unit, an erase count of the first physical erasing unit, a bit error rate of one or more physical programming units in the first physical erasing unit or a combination of aforesaid information.

Figure 7B:
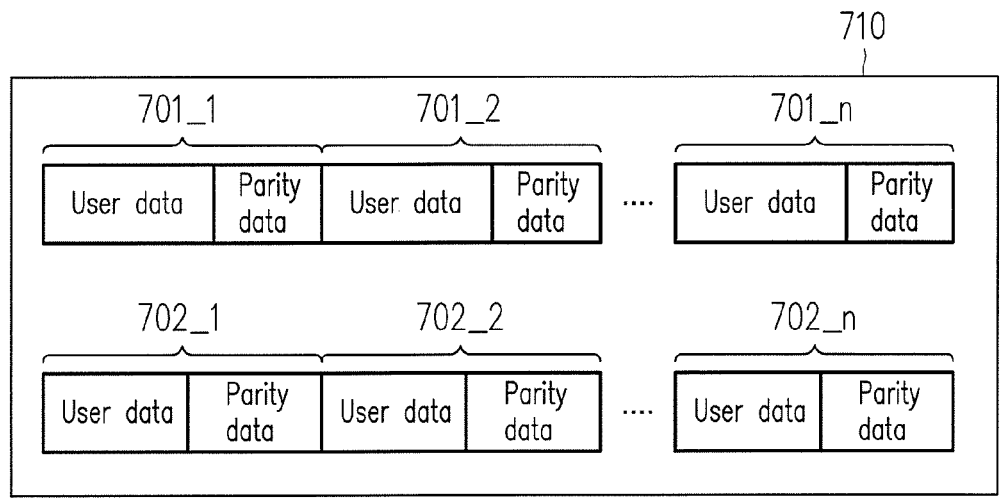
FIG. 7B is a schematic diagram illustrating the data encoded based on a first encoding rule according to an exemplary embodiment of the invention.

FIG. 7B is a schematic diagram illustrating the data encoded based on a first encoding rule according to an exemplary embodiment of the invention.

Referring to FIG. 7B, after the memory storage device 10 is used for a period of time, the memory management circuit 502 may configure one first encoding rule for the physical erasing unit 710 according to the bit error rate of the first-type physical programming units 701_1 to 701_$n$ and/or the bit error rate of the second-type physical programming units 702_1 to 702_$n$. The first encoding rule includes encoding the data to be stored to each of the first-type physical programming units 701_1 to 701_$n$ based on one code rate (hereinafter, also known as a first code rate) and encoding the data to be stored to each of the second-type physical programming units 702_1 to 702_$n$ based on another code rate (hereinafter, also known as a second code rate), where a value of the first code rate is greater than a value of the default code rate, and a value of the second code rate is less than the value of the default code rate.

Because the value of the first code rate is greater than the value of the default code rate, the data volume of the user data stored in each of the first-type physical programming units in FIG. 7B is greater than the data volume of the user data stored in each of the first-type physical programming units in FIG. 7A, and the data volume of the parity data stored in each of the first-type physical programming units in FIG. 7B is less than the data volume of the parity data stored in each of the first-type physical programming units in FIG. 7A. Further, because the value of the second code rate is less than the value of the default code rate, the data volume of the user data stored in each of the second-type physical programming units in FIG. 7B is less than the data volume of the user data stored in each of the second-type physical programming units in FIG. 7A, and the data volume of the parity data stored in each of the second-type physical programming units in FIG. 7B is greater than the data volume of the parity data stored in each of the second-type physical programming units in FIG. 7A.

In an exemplary embodiment, a sum of the value of the first code rate and the value of the second code rate is equal to two times the value of the default code rate. Also, the reliability of the first-type physical programming unit is higher than the reliability of the second-type physical programming unit. Therefore, by increasing the first code rate and decreasing the second code rate, the lifetime of the first physical erasing unit may be extended without reducing a total data volume of the first physical erasing unit for storing data. Taking FIG. 7B for example, even if the errors in the data read from any one of the second-type physical programming units 702_1 to 702_$n$ become increasingly more, it is still highly possible that those errors may be corrected by decreasing the second code rate (i.e., increasing the data volume of the parity bits stored in each of the second-type physical programming units). Accordingly, a time point when the physical erasing unit 710 is considered as the bad block may be delayed.

Figure 8A:
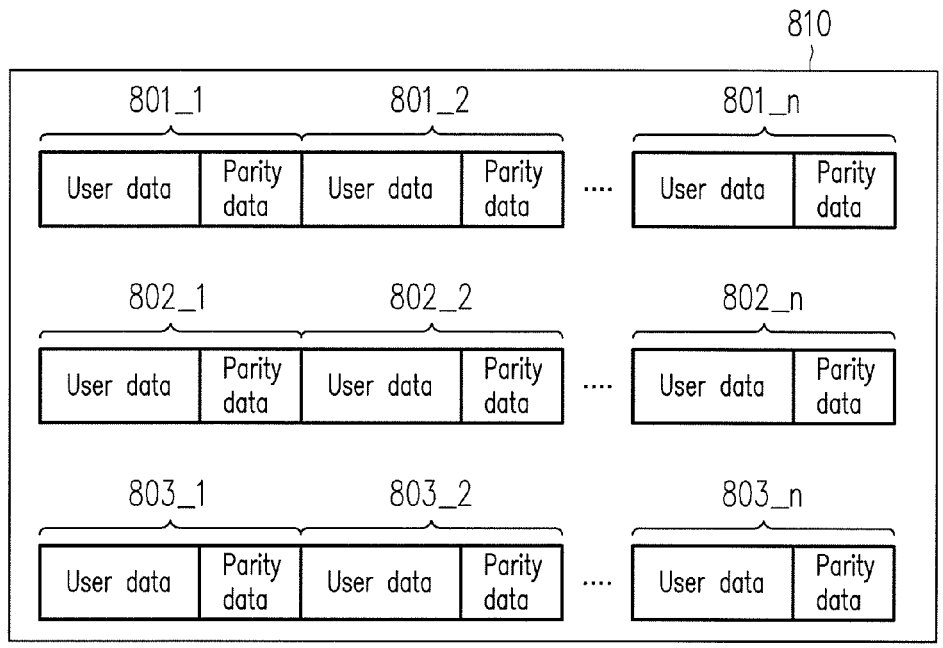
FIG. 8A is a schematic diagram illustrating the data encoded based on a default encoding rule according to another exemplary embodiment of the invention.

FIG. 8A is a schematic diagram illustrating the data encoded based on a default encoding rule according to another exemplary embodiment of the invention.

Referring to FIG. 8A, in the present exemplary embodiment, a physical erasing unit 810 serves as the first physical erasing unit, and each memory cell in the physical erasing unit 810 can store three bits. The physical erasing unit 810 includes a plurality of physical programming units 801_1 to 801_$n$, a plurality of second-type physical programming units 802_1 to 802_$n$ and a plurality of third-type physical programming units 803_1 to 803_$n$. Among them, each of the first-type physical programming units 801_1 to 801_n is one lower physical programming unit, each of the second-type physical programming units 802_1 to 802_n is one upper physical programming unit, and each of the third-type physical programming units 803_1 to 803_n is one extra physical programming unit. Further, the first-type physical programming unit 801_1, the second-type physical programming unit 802_1 and the third-type physical programming unit 803_1 are composed of the memory cells on the same word line; and by analogy, the first-type physical programming unit 801_n, the second-type physical programming unit 802_n and the third-type physical programming unit 803_n are composed of the memory cells on the same word line.

In the initial stage of using the memory storage device 10, the memory management circuit 502 configures one default encoding rule for the physical erasing unit 810. The default encoding rule includes encoding data to be stored to each physical programming unit in the physical erasing unit 810 based on the same default code rate by the error checking and correcting circuit 508, as shown in FIG. 8A.

Figure 8B:
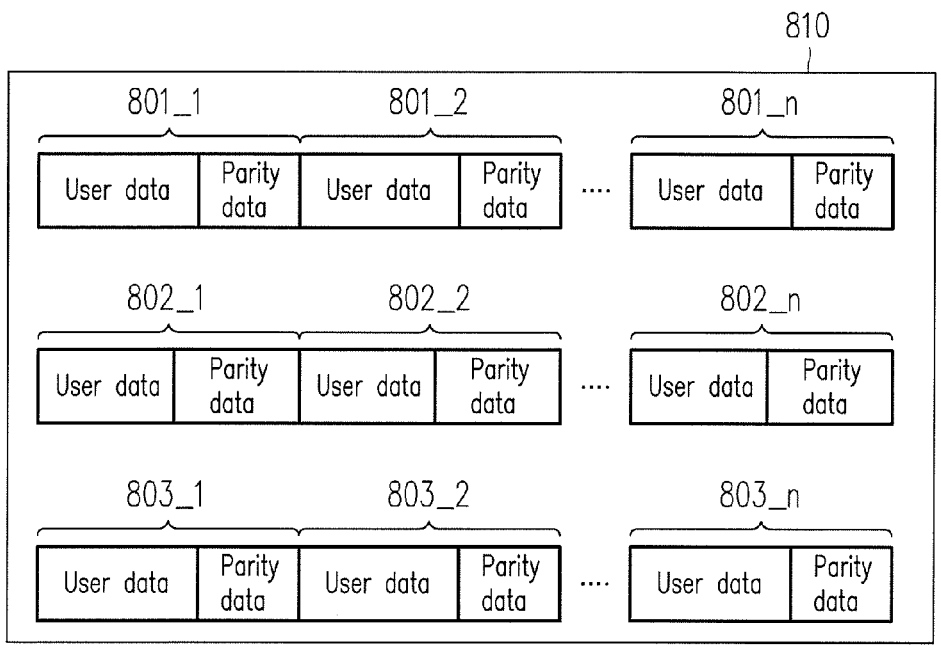
FIG. 8B is a schematic diagram illustrating the data encoded based on a first encoding rule according to another exemplary embodiment of the invention.

FIG. 8B is a schematic diagram illustrating the data encoded based on a first encoding rule according to another exemplary embodiment of the invention.

Referring to FIG. 8B, after the memory storage device 10 is used for a period of time, the memory management circuit 502 configures one first encoding rule for the physical erasing unit 810 according to the bit error rate of the first-type physical programming units 801_1 to 801_n, the bit error rate of the second-type physical programming units 802_1 to 802_n and/or the bit error rate of the third-type physical programming units 803_1 to 803_n. The first encoding rule includes encoding data to be stored to each of the first-type physical programming units 801_1 to 801_n based on the first code rate, encoding data to be stored to each of the second-type physical programming units 802_1 to 802_n based on the second code rate, and encoding data to be stored to each of the third-type physical programming units 803_1 to 803_n based on another code rate (hereinafter, also known as a third code rate). A value of the first code rate is greater than a value of the default code rate, and a value of the second code rate is less than the value of the default code rate. In an exemplary embodiment, a sum of the value of the first code rate, the value of the second code rate and a value of the third code rate is equal to three times the value of the default code rate. In an exemplary embodiment, the value of the third code rate is equal to the value of the default code rate. Nonetheless, in another exemplary embodiment, it is also possible that the value of the third code rate is not equal to the value of the default code rate but changing along with the value of the first code rate and/or the value of the second code rate.

It is noted that, although the first encoding rule, the first code rate, the second code rate and the third code rate are determined according to the bit error rate of one or more physical programming units of the first physical erasing unit in FIG. 7A, FIG. 7B, FIG. 8A and FIG. 8B, the first encoding rule, the first code rate, the second code rate, the third code rate may also be determined by using other error estimating information in another exemplary embodiment. For example, in an exemplary embodiment of FIG. 8A and FIG. 8B, the default code rate is "0.889". When the erase count of a second-type physical programming unit 802_2 is increased to "1750", the encoding rule corresponding to the physical erasing unit 810 is updated to the first encoding rule, and the first code rate, the second code rate and the third code rate are set as "0.903", "0.875" and "0.889", respectively. Then, when the erase count of the second-type physical programming unit 802_2 is further increased to "2000", the encoding rule corresponding to the physical erasing unit 810 is correspondingly updated as another first encoding rule, and the first code rate, the second code rate and the third code rate are updated as "0.917", "0.861" and "0.889", respectively. For example, the erase count of the second-type physical programming unit 802_2 may be inputted to a lookup table, and at least one of an updated first code rate, an updated second code rate and an updated third code rate may be obtained according to an output of the lookup table. Further, in the foregoing exemplary embodiment, the erase count of one second-type physical programming unit increased by "150" serves as a trigger condition for updating the encoding rule of the corresponding physical erasing unit. In other exemplary embodiments, other trigger conditions may also be configured in correspondence to the different error estimating information. For example, a time point for updating the current encoding rule may be controlled in response to that one preset value is added to the bit error rate of one specific second-type physical programming unit.

In an exemplary embodiment, the default encoding rule for the first physical erasing unit is continually used until the error estimating information of one physical programming unit in the physical erasing unit matches a preset condition. The first encoding rule is configured for the first physical erasing unit (only) when the error estimating information of such physical programming unit matches the preset condition. For example, in an exemplary embodiment of FIG. 8A and FIG. 8B, before the erase count of the second-type physical programming unit 802_2 reaches "1500", the default code rate is continually used for encoding data to be stored to the physical erasing unit 810; after the erase count of the second-type physical programming unit 802_2 reaches "1500", the first code rate, the second code rate and the third code rate may be determined and configured for the physical programming units of the corresponding type in the physical erasing unit 810. In addition, the exemplary embodiments of FIG. 7A, FIG. 7B, FIG. 8A and FIG. 8B may be applied to any physical erasing unit for storing data in FIG. 6.

FIG. 9 is a schematic diagram illustrating the error checking and correcting circuit according to an exemplary embodiment of the invention.

Referring to FIG. 9, in an exemplary embodiment, the error checking and correcting circuit 508 includes a code rate selector 901 and an encoding circuit 902, where the code rate selector 901 is connected to the encoding circuit 902. When user data Data is to be encoded, the code rate selector 901 receives the user data Data and corresponding system information SI. For example, the user data Data and the system information SI match to each other. The system information SI indicates that the user data Data is to be stored to a specific physical programming unit and the specific physical programming unit belongs to a specific physical erasing unit. Based on the system information SI, the code rate selector 901 determines one code rate parameter Para according to the encoding rule currently configured for the specific physical erasing unit to which the indicated specific physical programming unit belongs. The code rate parameter Para corresponds to one specific code rate. According to the code rate parameter Para, the encoding circuit 902 encodes the user data Data based on the specific code rate and output encoded data Data_Encoded matching the specific code rate. Taking FIG. 8B for example, if the user data Data is preset to be stored to the second-type physical programming unit 802_2, the encoded data Data_Encoded (including the user data Data and the corresponding parity data) generated after the user data Data is encoded based on the second code rate is then stored to the second-type physical programming unit 802_2.

In another exemplary embodiment, the system information SI may further include the error estimating information of the physical programming unit for storing the user data Data. Based on the error estimating information, the code rate selector 901 can find the code rate corresponding to aforesaid physical programming unit and output the corresponding encoding parameter Para according to the encoding rule currently configured for the physical erasing unit to which the physical programming unit belongs. Taking FIG. 8B for example, if the user data Data is preset to be stored to a second-type physical programming unit 802_1, the code rate selector 901 can find that the second-type physical programming unit 802_1 corresponds to the second code rate based on the first encoding rule and output the corresponding encoding parameter Para according to the system information SI. According to the encoding parameter Para, the encoding circuit 902 can encode the user data Data based on the second code rate and generate the encoded data Data_Encoded.

FIG. 10 is a flowchart illustrating a memory management method according to an exemplary embodiment of the invention.

Referring to FIG. 10, in step S1001, a default encoding rule is configured for a first physical erasing unit, where the default encoding rule includes encoding data to be stored to a first-type physical programming unit belonging to the first physical erasing unit based on a default code rate and encoding data to be stored to a second-type physical programming unit belonging to the first physical erasing unit based on the default code rate. In step S1002, error estimating information of the first physical erasing unit is obtained. In step S1003, a first encoding rule is configured for the first physical erasing unit according to the error estimating information of the first physical erasing unit, where the first encoding rule includes encoding the data to be stored to the first-type physical programming unit belonging to the first physical erasing unit based on a first code rate and encoding the data to be stored to the second-type physical programming unit belonging to the first physical erasing unit based on a second code rate, where a value of the first code rate is greater than a value of the default code rate, and a value of the second code rate is less than the value of the default code rate. After step S1003 is performed, if a trigger condition for updating the encoding rule is met, step S1002 may be repeatedly performed. By dynamically adjusting the encoding rule of the first physical erasing unit, the lifetime of the first physical erasing unit may be extended.

Nevertheless, steps depicted in FIG. 10 are described in detail as above so that related description thereof is omitted hereinafter. It is noted that, the steps depicted in FIG. 10 may be implemented as a plurality of program codes or circuits, which are not particularly limited in the invention. Moreover, the method disclosed in FIG. 10 may be implemented by reference with above exemplary embodiments, or may be implemented separately, which are not particularly limited in the invention.

In summary, the invention is capable of automatically updating the encoding rule corresponding to the specific physical erasing unit. By controlling the code rate of the physical programming units of various types belonging to the specific physical erasing unit, the lifetime of the specific physical erasing unit may be extended. As a result, the overall lifetime of the memory storage device may also be extended.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory management method for a rewritable non-volatile memory module comprising a plurality of physical erasing units, the memory management method comprising:
configuring a default encoding rule for a first physical erasing unit among the physical erasing units, wherein the default encoding rule comprises encoding data to be stored to a first-type physical programming unit belonging to the first physical erasing unit based on a default code rate and encoding data to be stored to a second-type physical programming unit belonging to the first physical erasing unit based on the default code rate;
obtaining error estimating information of the first physical erasing unit; and
configuring a first encoding rule for the first physical erasing unit according to the error estimating information of the first physical erasing unit, wherein the first encoding rule comprises encoding the data to be stored to the first-type physical programming unit belonging to the first physical erasing unit based on a first code rate and encoding the data to be stored to the second-type physical programming unit belonging to the first physical erasing unit based on a second code rate,
wherein a value of the first code rate is greater than a value of the default code rate, wherein a value of the second code rate is less than the value of the default code rate,
wherein the first-type physical programming unit is a lower physical programming unit, and the second-type physical programming unit is an upper physical programming unit.

2. The memory management method of claim 1, wherein a sum of the value of the first code rate and the value of the second code rate is equal to two times the value of the default code rate.

3. The memory management method of claim 1, wherein the default encoding rule further comprises encoding data to be stored to a third-type physical programming unit belonging to the first physical erasing unit based on the default code rate,
wherein the first encoding rule further comprises encoding the data to be stored to the third-type physical programming unit belonging to the first physical erasing unit based on a third code rate,
wherein a sum of the value of the first code rate, the value of the second code rate and a value of the third code rate is equal to three times the value of the default code rate.

4. The memory management method of claim 3, wherein the third-type physical programming unit is an extra physical programming unit.

5. The memory management method of claim 3, wherein the value of the third code rate is equal to the value of the default code rate.

6. The memory management method of claim 1, wherein the step of configuring the first encoding rule for the first physical erasing unit according to the error estimating information of the first physical erasing unit comprises:

determining the first code rate and the second code rate according to a bit error rate of the first-type physical programming unit belonging to the first physical erasing unit or the second-type physical programming unit belonging to the first physical erasing unit.

7. A memory storage device, comprising:

a connection interface unit, configured to couple to a host system;

a rewritable non-volatile memory module comprising a plurality of physical erasing units; and a memory control circuit unit, coupled to the connection interface unit and the rewritable non-volatile memory module, wherein the memory control circuit unit is configured to configure a default encoding rule for a first physical erasing unit among the physical erasing units, wherein the default encoding rule comprises encoding data to be stored to a first-type physical programming unit belonging to the first physical erasing unit based on a default code rate and encoding data to be stored to a second-type physical programming unit belonging to the first physical erasing unit based on the default code rate, wherein the memory control circuit unit is further configured to obtain error estimating information of the first physical erasing unit, wherein the memory control circuit unit is further configured to configure a first encoding rule for the first physical erasing unit according to the error estimating information of the first physical erasing unit, wherein the first encoding rule comprises encoding the data to be stored to the first-type physical programming unit belonging to the first physical erasing unit based on a first code rate and encoding the data to be stored to the second-type physical programming unit belonging to the first physical erasing unit based on a second code rate, wherein a value of the first code rate is greater than a value of the default code rate, wherein a value of the second code rate is less than the value of the default code rate, wherein the first-type physical programming unit is a lower physical programming unit, and the second-type physical programming unit is an upper physical programming unit.

8. The memory storage device of claim 7, wherein a sum of the value of the first code rate and the value of the second code rate is equal to two times the value of the default code rate.

9. The memory storage device of claim 7, wherein the default encoding rule further comprises encoding data to be stored to a third-type physical programming unit belonging to the first physical erasing unit based on the default code rate, wherein the first encoding rule further comprises encoding the data to be stored to the third-type physical programming unit belonging to the first physical erasing unit based on a third code rate, wherein a sum of the value of the first code rate, the value of the second code rate and a value of the third code rate is equal to three times the value of the default code rate.

10. The memory storage device of claim 9, wherein the third-type physical programming unit is an extra physical programming unit.

11. The memory storage device of claim 9, wherein the value of the third code rate is equal to the value of the default code rate.

12. The memory storage device of claim 7, wherein the operation of configuring the first encoding rule for the first physical erasing unit according to the error estimating information of the first physical erasing unit by the memory control circuit unit comprises:

determining the first code rate and the second code rate according to a bit error rate of the first-type physical programming unit belonging to the first physical erasing unit or the second-type physical programming unit belonging to the first physical erasing unit.

13. A memory control circuit unit for controlling a rewritable non-volatile memory module comprising a plurality of physical erasing units, the memory control circuit unit comprising:

a host interface, configured to couple to a host system;

a memory interface, configured to couple to the rewritable non-volatile memory module;

an error checking and correcting circuit; and a memory management circuit, coupled to the host interface, the memory interface and the error checking and correcting circuit, wherein the memory management circuit is configured to configure a default encoding rule for a first physical erasing unit among the physical erasing units, wherein the default encoding rule comprises encoding data to be stored to a first-type physical programming unit belonging to the first physical erasing unit based on a default code rate and encoding data to be stored to a second-type physical programming unit belonging to the first physical erasing unit based on the default code rate by the error checking and correcting circuit, wherein the memory management circuit is further configured to obtain error estimating information of the first physical erasing unit, wherein the memory management circuit is further configured to configure a first encoding rule for the first physical erasing unit according to the error estimating information of the first physical erasing unit, wherein the first encoding rule comprises encoding the data to be stored to the first-type physical programming unit belonging to the first physical erasing unit based on a first code rate and encoding the data to be stored to the second-type physical programming unit belonging to the first physical erasing unit based on a second code rate by the error checking and correcting circuit, wherein a value of the first code rate is greater than a value of the default code rate, wherein a value of the second code rate is less than the value of the default code rate, wherein the first-type physical programming unit is a lower physical programming unit, and the second-type physical programming unit is an upper physical programming unit.

14. The memory control circuit unit of claim 13, wherein a sum of the value of the first code rate and the value of the second code rate is equal to two times the value of the default code rate.

15. The memory control circuit unit of claim 13, wherein the default encoding rule further comprises encoding data to be stored to a third-type physical programming unit belonging to the first physical erasing unit based on the default code rate by the error checking and correcting circuit, wherein the first encoding rule further comprises encoding the data to be stored to the third-type physical programming unit belonging to the first physical erasing unit based on a third code rate by the error checking and correcting circuit, wherein a sum of the value of the first code rate, the value of the second code rate and a value of the third code rate is equal to three times the value of the default code rate.

16. The memory control circuit unit of claim 15, wherein the third-type physical programming unit is an extra physical programming unit.

17. The memory control circuit unit of claim 15, wherein the value of the third code rate is equal to the value of the default code rate.

18. The memory control circuit unit of claim 13, wherein the operation of configuring the first encoding rule for the first physical erasing unit according to the error estimating information of the first physical erasing unit by the memory management circuit comprises:
   determining the first code rate and the second code rate according to a bit error rate of the first-type physical programming unit belonging to the first physical erasing unit or the second-type physical programming unit belonging to the first physical erasing unit.

* * * * *